(12) United States Patent
Ma et al.

(10) Patent No.: US 10,934,620 B2
(45) Date of Patent: Mar. 2, 2021

(54) INTEGRATION OF DUAL REMOTE PLASMAS SOURCES FOR FLOWABLE CVD

(71) Applicant: Applied Materials, Inc., Santa Clara, CA (US)

(72) Inventors: Ying Ma, Castro Valley, CA (US); Daemian Raj, Fremont, CA (US); Jay D. Pinson, II, San Jose, CA (US); DongQing Li, Fremont, CA (US); Jingmei Liang, San Jose, CA (US); Yizhen Zhang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 205 days.

(21) Appl. No.: 15/822,276

(22) Filed: Nov. 27, 2017

(65) Prior Publication Data

US 2018/0148840 A1    May 31, 2018

Related U.S. Application Data

(60) Provisional application No. 62/427,544, filed on Nov. 29, 2016.

(51) Int. Cl.
*C23C 16/455* (2006.01)
*C23C 16/44* (2006.01)
(Continued)

(52) U.S. Cl.
CPC .... *C23C 16/45565* (2013.01); *C23C 16/4405* (2013.01); *C23C 16/452* (2013.01);
(Continued)

(58) Field of Classification Search
CPC ............ C23C 16/45565; C23C 16/452; C23C 16/45578; C23C 16/4558; C23C 16/54;
(Continued)

(56) References Cited

U.S. PATENT DOCUMENTS 5,558,717 A    9/1996  Zhao et al.
5,792,272 A *  8/1998  van Os .............. C23C 16/4405
                                                    118/723 R
(Continued)

FOREIGN PATENT DOCUMENTS

JP     05175135 A  *  7/1993
TW        283250 B     8/1996

OTHER PUBLICATIONS

Office Action for Taiwan Application No. 106141333 dated Dec. 13, 2019.

(Continued)

*Primary Examiner* — Rudy Zervigon
(74) *Attorney, Agent, or Firm* — Patterson + Sheridan, LLP

(57) ABSTRACT

Implementations described herein generally relate to an apparatus for forming flowable films. In one implementation, the apparatus is a processing chamber including a first RPS coupled to a lid of the processing chamber and a second RPS coupled to a side wall of the processing chamber. The first RPS is utilized for delivering deposition radicals into a processing region in the processing chamber and the second RPS is utilized for delivering cleaning radicals into the processing region. The processing chamber further includes a radical delivery ring disposed between a showerhead and a substrate support for delivering cleaning radicals from the second RPS into the processing region. Having separate RPSs for deposition and clean along with introducing radicals from the RPSs into the processing region using separate delivery channels minimizes cross contamination and cyclic change on the RPSs, leading to improved deposition rate drifting and particle performance.

15 Claims, 5 Drawing Sheets

(51) Int. Cl.
*C23C 16/54* (2006.01)
*H01J 37/32* (2006.01)
*C23C 16/452* (2006.01)
*C23C 16/458* (2006.01)

(52) U.S. Cl.
CPC ........ *C23C 16/458* (2013.01); *C23C 16/4558* (2013.01); *C23C 16/45578* (2013.01); *C23C 16/54* (2013.01); *H01J 37/32357* (2013.01); *H01J 37/32449* (2013.01); *H01J 37/32862* (2013.01)

(58) Field of Classification Search
CPC ... C23C 16/4405; C23C 16/458; C23C 16/50; H01J 37/32357; H01J 37/32862; H01J 37/32449; H01J 37/32798; H01J 37/32431
USPC .............. 118/715; 156/345.1, 345.4, 345.33
See application file for complete search history.

(56) References Cited

U.S. PATENT DOCUMENTS

| | | |
|---|---|---|
| 6,387,207 B1 | 5/2002 | Janakiraman et al. |
| 8,702,867 B2 * | 4/2014 | Choi ................. C23C 16/45565 |
| | | 118/715 |
| 2003/0124842 A1 | 7/2003 | Hytros et al. |
| 2009/0120368 A1 | 5/2009 | Lubomirsky et al. |
| 2014/0273410 A1 * | 9/2014 | Abedijaberi ...... H01L 21/02532 |
| | | 438/478 |

OTHER PUBLICATIONS

Search Report for Taiwan Application No. 106141333 dated Dec. 10, 2019.

\* cited by examiner

INTEGRATION OF DUAL REMOTE PLASMAS SOURCES FOR FLOWABLE CVD

CROSS-REFERENCE TO RELATED APPLICATIONS

This application claims priority to U.S. Provisional Patent Application Ser. No. 62/427,544, filed on Nov. 29, 2016, which herein is incorporated by reference.

BACKGROUND

Field

Implementations described herein generally relate to an apparatus for forming flowable films.

Description of the Related Art

Semiconductor device geometries have dramatically decreased in size since their introduction several decades ago. Modern semiconductor fabrication equipment routinely produce devices with 45 nm, 32 nm, and 28 nm feature sizes, and new equipment is being developed and implemented to make devices with even smaller geometries. The decreasing feature sizes result in structural features on the device having decreased width. The widths of gaps and trenches on the devices are narrow such that filling the gap with dielectric material becomes more challenging. Recently, flowable films have been used to fill the gaps, such as high-aspect ratio gaps. To achieve flowability, films have been deposited into the gaps using chemical vapor deposition (CVD) with radicals generated in a remote plasma source (RPS). The RPS is also utilized to generate radicals to clean the CVD chamber. Using the RPS for both deposition and cleaning causes surface changes in the RPS and components in the gas and radical delivery system, which results in defects, deposition rate drifting, and short service life.

Therefore, an improved apparatus is needed to form flowable films.

SUMMARY

Implementations described herein generally relate to an apparatus for forming flowable films. In one implementation, a ring includes an outer portion, an inner portion, wherein an annular channel is formed between the outer portion and the inner portion, wherein a plurality of channels is formed in the inner portion, and the plurality of channels is disposed asymmetrically with respect to a central axis of the ring, an upper portion connecting the outer portion and the inner portion, and a lower portion connecting the outer portion and the inner portion.

In another implementation, a processing chamber includes a lid, a chamber wall, wherein the lid is disposed over the chamber wall, a showerhead disposed below the lid, a substrate support disposed below the showerhead, and a radical delivery ring disposed between the showerhead and the substrate support, wherein the radical delivery ring includes an outer portion, an inner portion, wherein a plurality of channels are formed in the inner portion, an upper portion connecting the outer portion and the inner portion, and a lower portion connecting the outer portion and the inner portion.

In another implementation, a processing chamber includes a lid, a first remote plasma source disposed over the lid, a chamber wall, wherein the lid is disposed over the chamber wall, a second remote plasma source coupled to the chamber wall, a showerhead disposed below the lid, a substrate support disposed below the showerhead, and a radical delivery ring disposed between the showerhead and the substrate support

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only selected implementations of this disclosure and are therefore not to be considered limiting of its scope, for the disclosure may admit to other equally effective implementations.

To facilitate understanding, identical reference numerals have been used, wherever possible, to designate identical elements that are common to the Figures. Additionally, elements of one implementation may be advantageously adapted for utilization in other implementations described herein.

DETAILED DESCRIPTION

Implementations described herein generally relate to an apparatus for forming flowable films. In one implementation, the apparatus is a processing chamber including a first RPS coupled to a lid of the processing chamber and a second RPS coupled to a side wall of the processing chamber. The first RPS is utilized for delivering deposition radicals into a processing region in the processing chamber and the second RPS is utilized for delivering cleaning radicals into the processing region. The processing chamber further includes a radical delivery ring disposed between a showerhead and a substrate support for delivering cleaning radicals from the second RPS into the processing region. Having separate RPSs for deposition and clean along with introducing radicals from the RPSs into the processing region using separate delivery channels minimizes cross contamination and cyclic change on the RPSs, leading to improved deposition rate drifting and particle performance.

Figure 1:
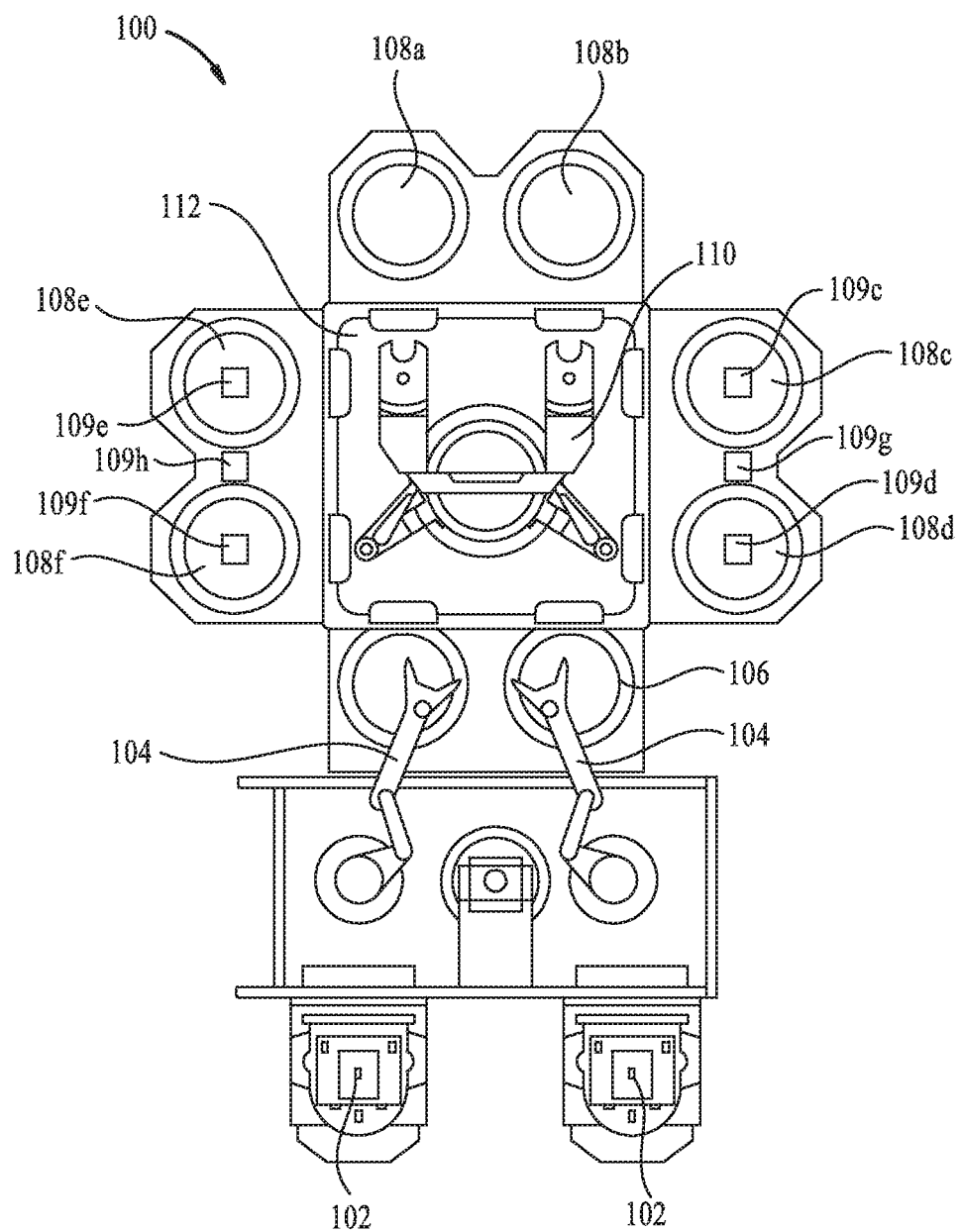
FIG. 1 is a schematic top plan view of a processing tool according to one implementation.

FIG. 1 is a schematic top plan view of a processing tool 100 according to one implementation. The processing tool 100, such as a cluster tool as shown in FIG. 1, includes a pair of front opening unified pods (FOUPs) 102 for supplying substrates, such as semiconductor wafers, that are received by robotic arms 104 and placed into load lock chambers 106. A second robotic arm 110 is disposed in a transfer chamber 112 coupled to the load lock chambers 106. The second robotic arm 110 is used to transport the substrates from the load lock chamber 106 to processing chambers 108a-108f coupled to the transfer chamber 112.

The processing chambers 108a-108f may include one or more system components for depositing, annealing, curing and/or etching a flowable film on the substrate. In one configuration, two pairs of the processing chambers (e.g., 108c-108d and 108e-108f) may be used to deposit the flowable film on the substrate, and the third pair of the processing chambers (e.g., 108a-108b) may be used to anneal/cure the deposited flowable film. In another configuration, the same two pairs of processing chambers (e.g., 108c-108d and 108e-108f) may be used to both deposit and anneal/cure the flowable film on the substrate, while the third pair of the processing chambers (e.g., 108a-108b) may be used to cure the flowable film on the substrate with ultraviolet (UV) or electron-beam (E-beam).

The processing chambers used for depositing the flowable film on the substrate (e.g., 108c, 108d, 108e, 108f) may each include a first RPS (e.g., 109c, 109d, 109e, 109f) disposed on a lid of the processing chamber. Each pair of processing chambers used for depositing the flowable film on the substrate (e.g., 108c-108d and 108e-108f) share a second RPS (e.g., 109g, 109h), which is disposed between each pair of processing chambers. For example, the second RPS 109g is disposed between the processing chamber 108c and the processing chamber 108d, and the second RPS 109h is disposed between the processing chamber 108e and processing chamber 108f. In some implementations, each pair of processing chambers 108a-108b, 108c-108d, and 108e-108f is a single processing chamber including two substrate supports and capable of processing two substrates. In such implementations, each processing chamber includes two first RPSs, each disposed on the lid of the processing chamber over a corresponding substrate support, and one second RPS disposed on the lid of the processing chamber between the two first RPSs.

Each of the first RPSs 109c, 109d, 109e, and 109f is configured to excite a precursor gas, such as a silicon containing gas, an oxygen containing gas, and/or a nitrogen containing gas, to form precursor radicals that form a flowable film on the substrate disposed in each of the processing chambers 108c, 108d, 108e, and 108f, respectively. Each of the second RPSs 109g and 109h is configured to excite a cleaning gas, such as a fluorine containing gas, to form cleaning radicals that clean components of each pair of the processing chambers 108c-108d and 108e-108f, respectively.

Figure 2:
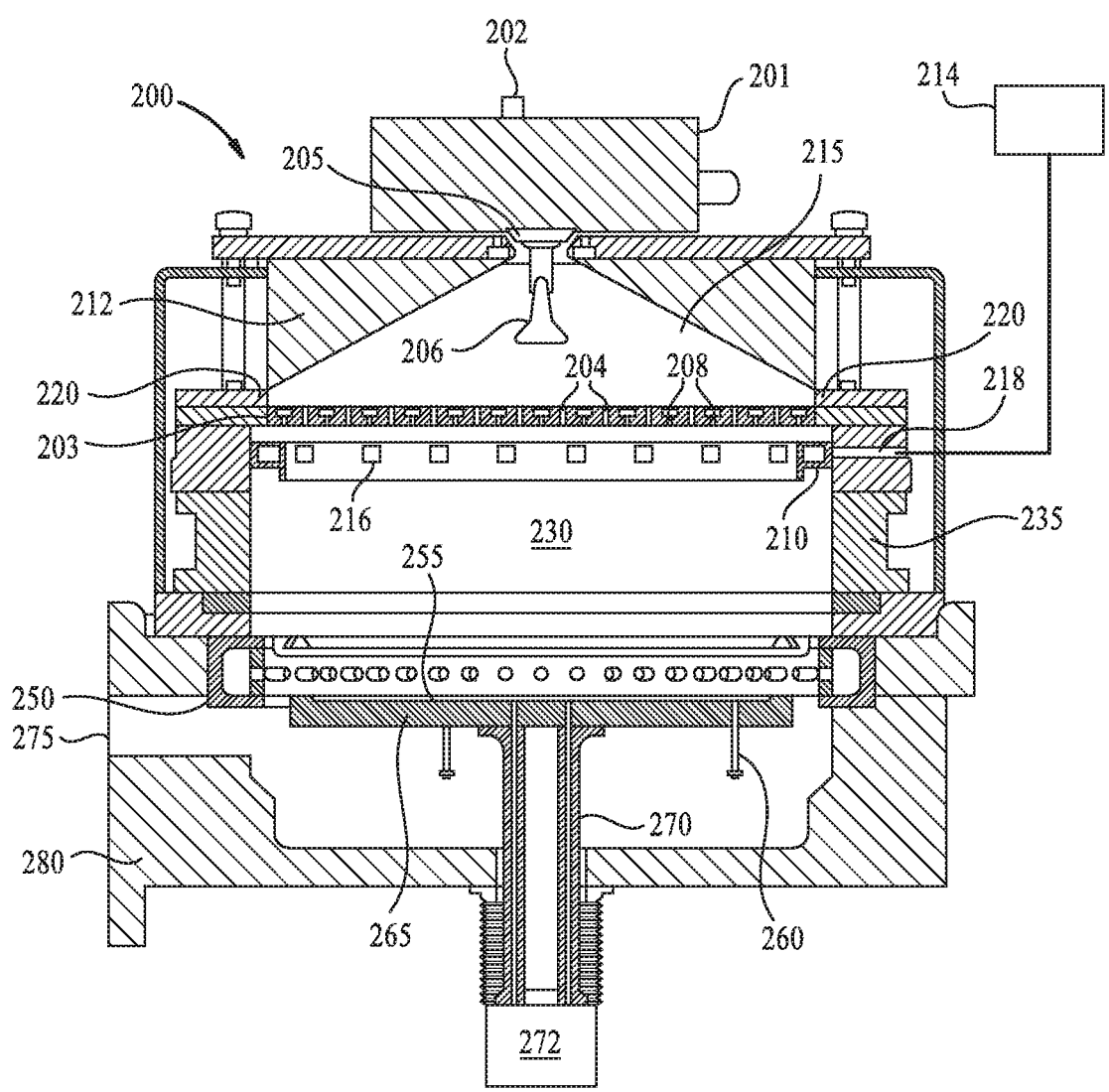
FIG. 2 is a schematic cross-sectional side view of a processing chamber according to one implementation.

FIG. 2 is a schematic cross-sectional side view of a processing chamber 200 according to one implementation. The processing chamber 200 may be a deposition chamber, such as a CVD deposition chamber. The processing chamber 200 may be any of the processing chambers 108a-108f that is configured at least to deposit a flowable film on a substrate. The processing chamber 200 includes a lid 212 disposed over a chamber wall 235, and an insulating ring 220 disposed between the lid 212 and the chamber wall 235. A first RPS 201 is disposed on the lid 212 and precursor radicals formed in the first RPS 201 are flowed into a plasma zone 215 of the processing chamber 200 via a radical inlet assembly 205 and a baffle 206. While the first RPS 201 is illustrated as coupled to the lid 212, it is contemplated that he first RPS 201 may be spaced from the lid 212 and fluidly coupled to the lid 212 by one or more conduits. A precursor gas inlet 202 is formed on the first RPS 201 for flowing one or more precursor gases into the first RPS 201.

The processing chamber 200 further includes a dual-zone showerhead 203. The dual-zone showerhead 203 includes a first plurality of channels 204 and a second plurality of channels 208. The first plurality of channels 204 and the second plurality of channels 208 are not in fluid communication. During operation, radicals in the plasma zone 215 flow into a processing region 230 through the first plurality of channels 204 of the dual-zone showerhead 203, and one or more precursor gases flow into the processing region 230 through the second plurality of channels 208. With the dual-zone showerhead 203, premature mixing and reaction between the radicals and the precursor gases are avoided.

The processing chamber 200 includes a substrate support 265 for supporting a substrate 255 during processing. The processing region 230 is defined by the dual-zone showerhead 203 and the substrate support 265. A radical delivering ring 210 is disposed between the dual-zone showerhead 203 and the substrate support 265. The radical delivery ring 210 is utilized to deliver cleaning radicals into the processing region 230 from a second RPS 214 fluidly coupled to processing region 230 through the chamber wall 235 of the processing chamber 200. The radical delivery ring 210 includes a plurality of channels 216 for delivering cleaning radicals into the processing region 230. The second RPS 214 may be coupled to an inlet 218 formed in the chamber wall 235, and the radical delivery ring 210 is aligned with the inlet 218 to receive the cleaning radicals from the second RPS 214. Since the precursor gas and precursor radicals mix and react in the processing region below the dual-zone showerhead 203, deposition primarily occurs below the dual-zone showerhead 203 except some minor back diffusion. Thus, the components of the processing chamber 200 disposed below the dual-zone showerhead 203 may be cleaned after periodic processing. Cleaning is referring to removing material deposited on the chamber components. Since minor deposition may occur at locations above (upstream) of the dual-zone showerhead 203, flowing cleaning radicals into the plasma zone 215 can lead to component surface change, such as surface fluorination, since fluorine radicals may be used as cleaning radicals. Thus, introducing cleaning radicals from the first RPS 201 can lead to unnecessary cleaning of components above the dual-zone showerhead 203. Therefore, the cleaning radicals are introduced into the processing region 230 at a location below (downstream of) the dual-zone showerhead 203.

The first RPS 201 is configured to excite a precursor gas, such as a silicon containing gas, an oxygen containing gas, and/or a nitrogen containing gas, to form precursor radicals that form a flowable film on the substrate 255 disposed on the substrate support 265. The second RPS 214 is configured to excite a cleaning gas, such as a fluorine containing gas, to form cleaning radicals that clean components of the processing chamber 200, such as the substrate support 265 and the chamber wall 235. Having the first RPS 201 disposed on the lid 212 of the processing chamber 200 while the second RPS 214 coupled to the chamber wall 235 can achieve better deposition uniformity due to priority on deposition. In addition, introducing the cleaning radicals between the dual-zone showerhead 203 and the substrate support 265 can achieve high clean etch rate and improve clean rate distribution. Furthermore, the radicals used for depositing the flowable film on the substrate 255 are introduced into the processing region by the dual-zone showerhead 203, while the radicals used for cleaning the components of the processing chamber 200 are introduced into the processing region by the radical delivery ring 210. By separating the channels used for delivering deposition radicals and cleaning radicals, cross contamination and cyclic change on the components of the processing chamber 200 are reduced, which results in improved deposition rate drifting and particle performance.

The processing chamber 200 further includes a bottom 280, a slit valve opening 275 formed in the bottom 280, and a pumping ring 250 coupled to the bottom 280. The pumping ring 250 is utilized to remove residual precursor gases and radicals from the processing chamber 200. The processing chamber 200 further includes a plurality of lift pins 260 for raising the substrate 255 from the substrate support 265 and a shaft 270 supporting the substrate support 265. The shaft 270 is coupled to a motor 272 which can rotate the shaft 270, which in turn rotates the substrate support 265 and the substrate 255 disposed on the substrate support 265. Rotating the substrate support 265 during processing or cleaning can achieve improved deposition uniformity as well as clean uniformity, especially radius of the substrate support pocket.

Figure 3:
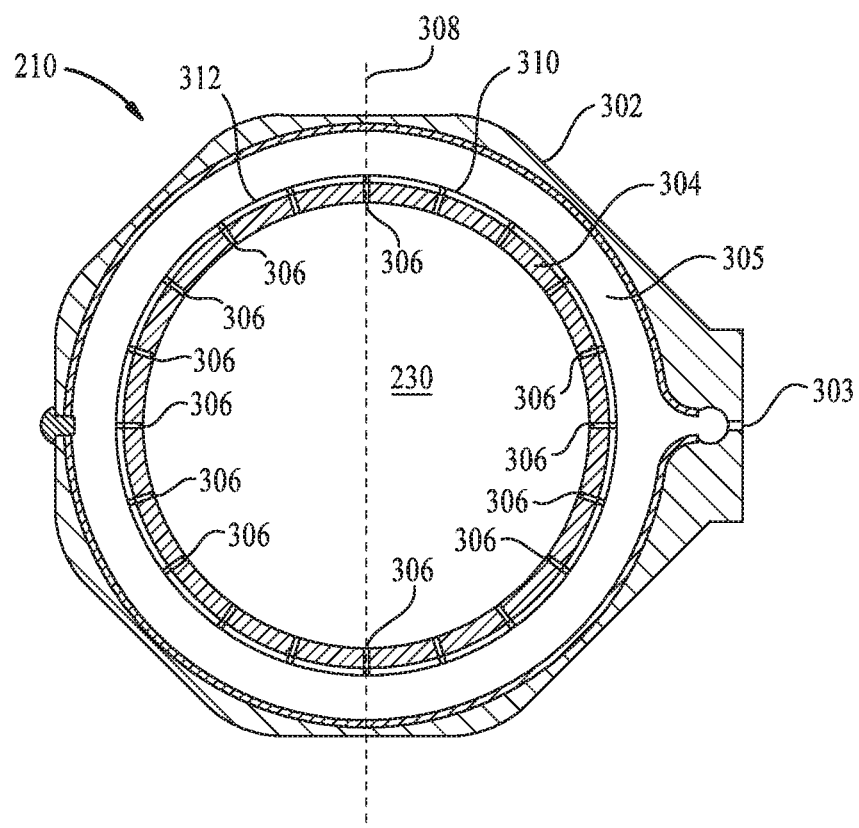
FIG. 3 is a schematic cross-sectional top view of a radical delivery ring according to one implementation.

FIG. 3 is a schematic cross-sectional top view of the radical delivery ring 210 according to one implementation. As shown in FIG. 3, the radical delivery ring 210 includes an outer portion 302, an inner portion 304, and a region 305, such as a channel, formed between the outer portion 302 and the inner portion 304. The region 305 may be annular, as shown in FIG. 3. An inlet 303 is formed in the outer portion 302. The inlet 303 is aligned with the inlet 218 formed in the chamber wall 235 (FIG. 2). A plurality of channels 306 are formed in the inner portion 304. The plurality of channels 306 may be the plurality of channels 216 shown in FIG. 2. In some implementations, the plurality of channels 306 has the same size and is disposed asymmetrically with respect to a central axis 308 of the radical delivery ring 210. In some implementations, the plurality of channels 306 has different sizes and is disposed symmetrically with respect to the central axis 308.

During cleaning, cleaning radicals flow into the region 305 via the inlet 303 from the second RPS 214 (FIG. 2). Cleaning radicals then flow into the processing region 230 via the plurality of channels 306 formed in the inner portion 304. The central axis 308 divides the inner portion 304 into an upstream portion 310 and a downstream portion 312. Upstream and downstream are referring to the flow of the radicals from the inlet 303. In some implementations, the plurality of channels 306 may be asymmetrically disposed in the inner portion 304 with respect to the central axis 308 so more channels 306 are disposed in the downstream portion 312 than in the upstream portion 310. In some implementations, the channels 306 disposed in the downstream portion 312 have larger size than the channels 306 disposed in the upstream portion 310. The different sizes in channels 306 with respect to the central axis 308 and the asymmetrical locations of the channels 306 with respect to the central axis 308 cause more radicals flow through the downstream portion 312 where the plasma concentration is low, leading to a more uniform cleaning of the chamber components.

Figure 4A:
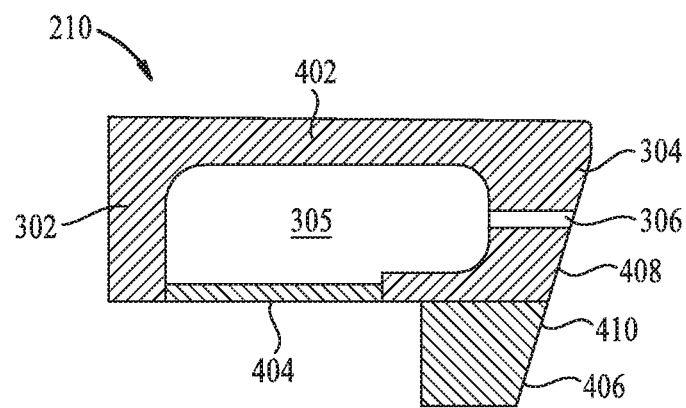
FIGS. 4A-4B are cross-sectional side views of a portion of the radical delivery ring according to implementations.
Figure 4B:
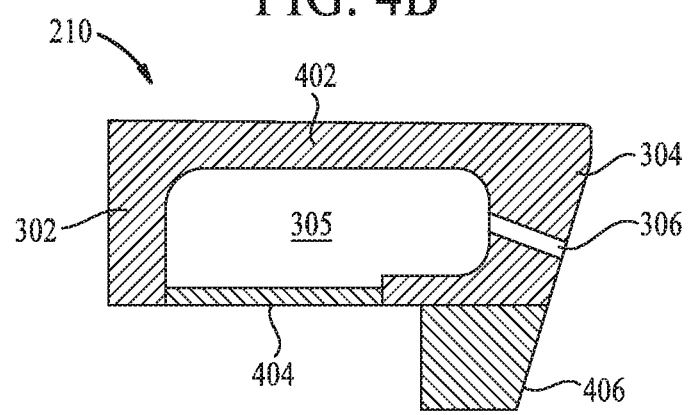

FIGS. 4A-4B are cross-sectional side view of a portion of the radical delivery ring 210 according to implementations. As shown in FIG. 4A, the radical delivery ring 210 includes the outer portion 302, the inner portion 304, an upper portion 402 connecting the outer portion 302 and the inner portion 304, and a lower portion 404 connecting the outer portion 302 and the inner portion 304. The region 305 is defined by the outer portion 302, inner portion 304, upper portion 402, and lower portion 404. A ring 406 is coupled to the inner portion 304. The inner portion 304 includes an inner surface 408 and the ring 406 includes an inner surface 410. Inner surfaces 408, 410 form a cone shape in order to uniformly distribute cleaning radicals into the processing region 230. The plurality of channels 306 may be substantially parallel to a major surface of the substrate support 265 (FIG. 2), as shown in FIG. 4A. Alternatively, the plurality of channels 306 are tilted downwardly toward the substrate support 265 (FIG. 2), as shown in FIG. 4B. In some implementations, the plurality of channels 306 has the same degree of titling. In some implementations, the plurality of channels 306 has different degree of tilting.

Figure 5:
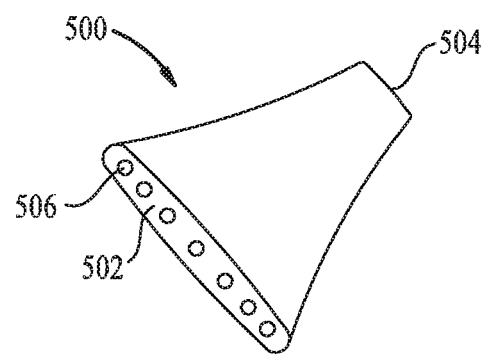
FIG. 5 is a schematic perspective view of a radical delivery device according to one implementation.

FIG. 5 is a schematic perspective view of a radical delivery device 500 according to one implementation. In some implementations, instead of using the radical delivery ring 210 (FIG. 2) to delivery cleaning radicals into the processing region 230 (FIG. 2), a radical delivery device 500 may be utilized. The radical delivery device 500 may be disposed in the chamber wall 235 (FIG. 2). The radical delivery device 500 includes a first end 502 and a second end 504. The second end 504 is coupled to the second RPS 214 (FIG. 2) and the first end 502 is facing the processing region 230 (FIG. 2). A plurality of channels 506 are formed in the radical delivery device 500 for delivering cleaning radicals into the processing region 230 from the second RPS 214 (FIG. 2). The cleaning radicals flow to the second end 504 from the second RPS 214 and then flow into the processing region 230 through the plurality of channels 506.

Figure 6:
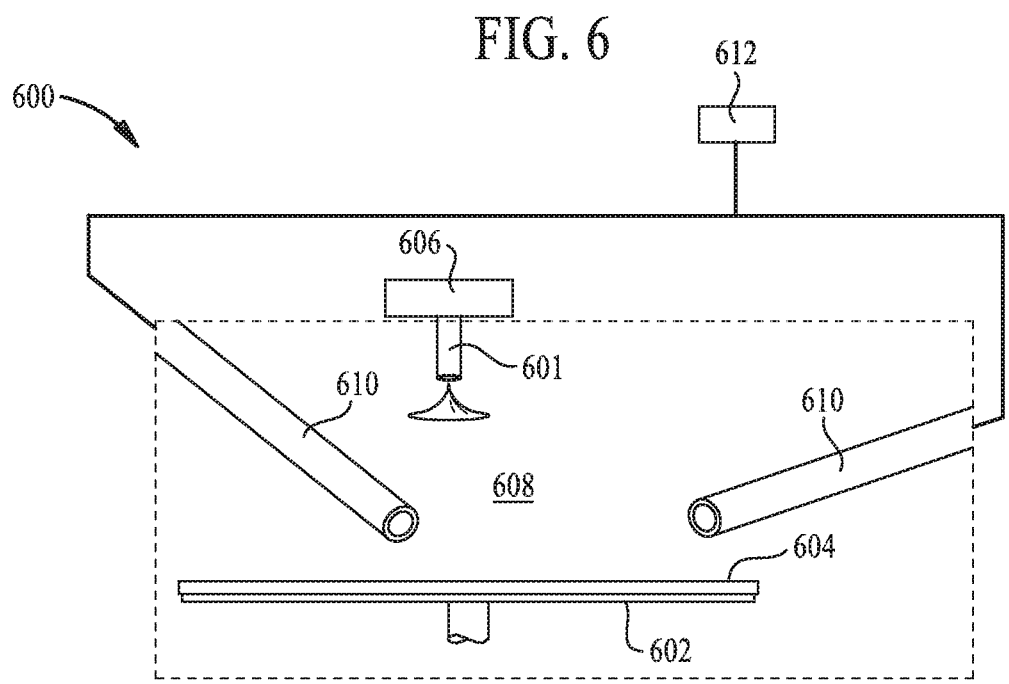
FIG. 6 is a schematic cross-sectional side view of the processing chamber according to another implementation.

FIG. 6 is a schematic side view of the processing chamber 600 according to another implementation. As shown in FIG. 6, the processing chamber 600 includes a radical inlet assembly 601, a substrate support 602 supporting a substrate 604. A first RPS 606 is coupled to the radical inlet assembly 601. During deposition processes, precursor radicals formed in the first RPS 606 is introduced into the processing region 608 by the radical inlet assembly 601. A dual-zone showerhead, such as the dual-zone showerhead 203 shown in FIG. 2, may be utilized in the processing chamber 600. The processing chamber 600 further includes a plurality of tubes 610 extended into the processing region 608. The plurality of tubes 610 is connected to a second RPS 612. During cleaning operations, cleaning radicals formed in the second RPS 612 is introduced into the processing region 608 by the plurality of tubes 610. The substrate support 602 may be rotated by a motor, such as the motor 272 shown in FIG. 2, in order to improve deposition and cleaning uniformity.

Figure 7:
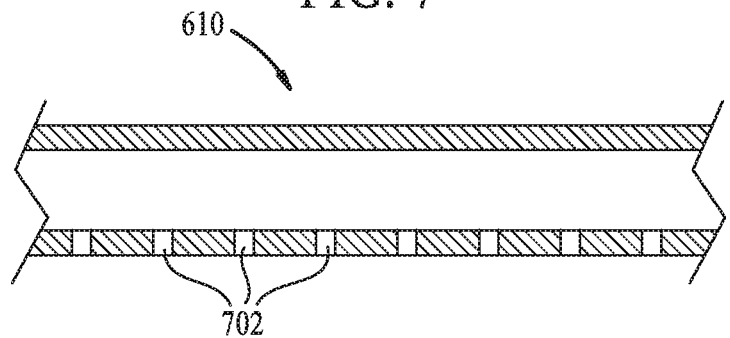
FIG. 7 is a schematic cross-sectional side view of a tube according to one implementation.

FIG. 7 is a schematic cross-sectional side view of the tube 610 according to one implementation. As shown in FIG. 7, the tube 610 includes a plurality of openings 702 for flowing cleaning radicals into the processing region 608 (FIG. 6). The location and size of the openings 702 may be varied in order to improve cleaning uniformity.

Having the first RPS disposed on the lid of the processing chamber while the second RPS coupled to the chamber wall can achieve better deposition uniformity due to priority on deposition. In addition, introducing the cleaning radicals between the dual-zone showerhead and the substrate support can achieve high clean etch rate and improve clean rate distribution. Furthermore, by separating the channels used for delivering deposition radicals and cleaning radicals, cross contamination and cyclic change on the components of the processing chamber are reduced, which results in improved deposition rate drifting and particle performance.

While the foregoing is directed to implementations of the present disclosure, other and further implementations of the disclosure may be devised without departing from the basic scope thereof, and the scope thereof is determined by the claims that follow.

The invention claimed is:

1. A ring, comprising:
an outer portion, having an inlet formed therethrough;
an inner portion;
an annular channel formed between the outer portion and the inner portion, the annular channel in fluid communication with the inlet;
a plurality of channels formed through the inner portion and encircling the inner portion, the plurality of channels fluidly coupled to the annular channel, wherein a line through a central axis of the ring defines an upstream portion and downstream portion of the ring, the inlet positioned in the upstream portion, the downstream portion positioned opposite the upstream portion, and the plurality of channels is disposed asymmetrically with respect to the line defining the upstream portion and the downstream portion, wherein the plurality of channels have larger diameters or closer spacing in the downstream portion as compared to the upstream portion;
an upper portion connecting the outer portion and the inner portion; and
a lower portion connecting the outer portion and the inner portion.

2. The ring of claim 1, wherein each channel of the plurality of channels is positioned at an acute angle relative to an interior surface of the inner portion.

3. The ring of claim 1, wherein the plurality of channels has different sizes.

4. The ring of claim 1, wherein each channel of the plurality of channels has the same size.

5. The ring of claim 1, wherein the downstream portion includes more channels of the plurality of channels than the upstream portion.

6. The ring of claim 1, wherein the downstream portion includes channels of the plurality of channels having a larger size than channels of the plurality of channels in the upstream portion.

7. A processing chamber, comprising:
a chamber wall;
a lid is disposed over the chamber wall;
a showerhead disposed below the lid;
a substrate support disposed below the showerhead, the showerhead and the substrate support defining a processing region therebetween; and
a radical delivery ring disposed between the showerhead and the substrate support within the processing region, wherein the radical delivery ring comprises:
an outer portion, having an inlet formed therethrough;
an inner portion;
an annular channel formed between the outer portion and the inner portion, the annular channel in fluid communication with the inlet;
a plurality of channels are formed through the inner portion and encircling the inner portion, the plurality of channels fluidly coupled to the annular channel, wherein a line through a central axis of the ring defines an upstream portion and downstream portion of the ring, the inlet positioned in the upstream portion, the downstream portion positioned opposite the upstream portion, and the plurality of channels is disposed asymmetrically with respect to the line defining the upstream portion and the downstream portion, wherein the plurality of channels have larger diameters or closer spacing in the downstream portion as compared to the upstream portion;
an upper portion connecting the outer portion and the inner portion; and
a lower portion connecting the outer portion and the inner portion.

8. The processing chamber of claim 7, wherein each channel of the plurality of channels is positioned at an acute angle relative to an interior surface of the inner portion.

9. The processing chamber of claim 7, wherein the plurality of channels has different sizes.

10. The processing chamber of claim 7, wherein the downstream portion includes more channels of the plurality of channels than the upstream portion.

11. The processing chamber of claim 7, wherein the downstream portion includes channels of the plurality of channels having larger size than channels of the plurality of channels in the upstream portion.

12. A processing chamber, comprising:
a chamber wall;
a lid disposed over the chamber wall and forming a processing region between the chamber wall and the lid;
a first remote plasma source fluidly coupled to the processing region through a first radical inlet assembly;
a second remote plasma source coupled to an inlet formed in the chamber wall;
a showerhead disposed below the lid and the first radical inlet assembly;
a substrate support disposed below the showerhead; and
a radical delivery ring disposed between the showerhead and the substrate support within the processing region, the radical delivery ring fluidly coupled to the inlet formed in the chamber wall, wherein the radical delivery ring comprises:
an outer portion, having an inlet formed therethrough;
an inner portion;
an annular channel formed between the outer portion and the inner portion, the annular channel in fluid communication with the inlet;
a plurality of channels formed through the inner portion and encircling the inner portion, the plurality of channels fluidly coupled to the annular channel, wherein a line through a central axis of the ring defines an upstream portion and downstream portion of the ring, the inlet positioned in the upstream portion, the downstream portion positioned opposite the upstream portion, and the plurality of channels is disposed asymmetrically with respect to the line defining the upstream portion and the downstream portion, wherein the plurality of channels have larger diameters or closer spacing in the downstream portion as compared to the upstream portion;
an upper portion connecting the outer portion and the inner portion; and
a lower portion connecting the outer portion and the inner portion.

13. The processing chamber of claim 12, wherein each channel of the plurality of channels is positioned at an acute angle relative to an interior surface of the inner portion.

14. The processing chamber of claim 12, wherein channels of the plurality of channels have different sizes.

15. The processing chamber of claim 12, further comprising a ring coupled to the lower portion of the radical delivery ring, wherein a radially inner surface of the ring is aligned with the inner surface of the radical delivery ring.

* * * * *